(12) United States Patent
Wada

(10) Patent No.: US 7,772,665 B2
(45) Date of Patent: Aug. 10, 2010

(54) SOLID-STATE IMAGING DEVICE

(75) Inventor: Tetsu Wada, Miyagi (JP)

(73) Assignee: Fujifilm Corporation, Tokyo (JP)

( * ) Notice: Subject to any disclaimer, the term of this patent is extended or adjusted under 35 U.S.C. 154(b) by 512 days.

(21) Appl. No.: 11/707,910

(22) Filed: Feb. 20, 2007

(65) Prior Publication Data
US 2007/0194358 A1   Aug. 23, 2007

(30) Foreign Application Priority Data
Feb. 23, 2006   (JP)   .......................... P2006-047081

(51) Int. Cl.
*H01L 29/72* (2006.01)
(52) U.S. Cl. .......................... 257/443; 257/431; 257/457
(58) Field of Classification Search .......... 257/E31.054, 257/E31.103, E31.069, 431, 443, 457
See application file for complete search history.

(56) References Cited
FOREIGN PATENT DOCUMENTS
JP   2004-55786 A   2/2004

*Primary Examiner*—Michael B Shingleton
(74) *Attorney, Agent, or Firm*—Birch, Stewart, Kolasch & Birch, LLP

(57) ABSTRACT

A first imaging portion includes a first group of photoelectric conversion elements. A second imaging portion includes a second group of photoelectric conversion elements. The first imaging portion and the second imaging portion are disposed at adjacent positions. An array pattern of the imaging portions is determined so that photoelectric conversion elements detecting all color components needed for reproducing a color image are included by two adjacent lines. Among pairs of adjacent lines, a line of the first imaging portion is paired with a line of the second imaging portion, which is selected so that the combination of color components detected by the photoelectric conversion elements arranged on the line of the first imaging portion differs from the combination of color components detected by the photoelectric conversion elements arranged on the line of the second imaging portion. Corresponding to each of the pairs, a first electrode adapted to control the reading of signals from the photoelectric conversion elements of the first imaging portion, and a second electrode adapted to control the reading of signals from the photoelectric conversion elements of the second imaging portion are electrically connected to a common reading terminal.

6 Claims, 4 Drawing Sheets

SOLID-STATE IMAGING DEVICE

BACKGROUND OF THE INVENTION

1. Field of the Invention

The present invention relates to a solid-state imaging device in which a large number of photoelectric conversion elements configured to detect color components of colors, such as R (red), G (green), and B (blue), are regularly arranged on a semiconductor substrate in a row direction and in a column direction according to a predetermined array pattern.

2. Description of the Related Art

In a solid-state imaging device employed by an apparatus, such as a digital camera, a large necessary number of photoelectric conversion elements (generally, photodiodes) are arranged in a two-dimensional square lattice to detect pixels of a two-dimensional image that is an object image. Also, generally, a plurality of photoelectric conversion elements respectively corresponding to R, G, and B colors are disposed in a two-dimensional arrangement by being regularly arranged in a row direction and in a column direction according to a specific array pattern.

Actually, a plurality of photoelectric conversion elements respectively corresponding to R, G, and B colors are arranged according to an array pattern called a Bayer array so as to optimize the quality of a taken color image. Also, generally, the characteristics of colors detected by the photoelectric conversion elements are determined by color filters disposed in front of light receiving surfaces of the photoelectric conversion elements. That is, an optical filter transmitting only R-color, an optical filter transmitting only G-color, and an optical filter transmitting only B-color are disposed in front of the position of each of the photoelectric conversion elements according to the Bayer array. In the case of using the optical filters, photoelectric conversion elements having same characteristics can be employed as those corresponding to each color.

Hitherto, as disclosed in, for example, JP-A-2004-055786, a honeycomb array pattern has been formed on a silicon substrate by disposing low-sensitivity photoelectric conversion elements having a low detection sensitivity, which are arranged like a square lattice, and high-sensitivity photoelectric conversion elements having a high detection sensitivity, which are arranged like a square lattice, so that each of the low-sensitivity photoelectric conversion elements is shifted to an adjacent position to an associated one of the high-sensitivity photoelectric conversion elements.

The detection sensitivity of the photoelectric conversion element is defined as a characteristic indicating an amount of signals that can be output from a photoelectric conversion element when a predetermined amount of light is incident upon this photoelectric conversion element. That is, when the same amount of light is incident upon a high-sensitivity photoelectric conversion element and a low-sensitivity photoelectric conversion element, an amount of signals output from the high-sensitivity photoelectric conversion element, whose detection sensitivity is relatively high, is more than that of signals output from the low-sensitivity photoelectric conversion element whose detection sensitivity is relatively low. The high-sensitivity photoelectric conversion element is most suitable for taking an image of an object of low light intensity, because a relatively large amount of signals can be obtained therefrom even when a relatively small amount of light is incident thereupon. However, when a relatively large amount of light is incident thereupon, the amount of signals outputted therefrom saturates in a short period of time. Therefore, the high-sensitivity photoelectric conversion element is unsuitable for taking an image of an object of high light intensity. Conversely, the high-sensitivity photoelectric conversion element is most suitable for taking an image of an object of high light intensity, because a large amount of signals cannot be obtained therefrom even when a relatively large amount of light is incident thereupon. However, when a relatively small amount of light is incident thereupon, the amount of signals outputted therefrom is too small. Therefore, the low-sensitivity photoelectric conversion element is unsuitable for taking an image of an object of low light intensity.

A solid-state imaging device configured in this way can simultaneously utilize the low-sensitivity photoelectric conversion element and the high-sensitivity photoelectric conversion element at each of pixels to be detected. Thus, the dynamic range of the imaging device can be increased by detecting light of a relatively large amount with the low-sensitivity photoelectric conversion element and also detecting light of a relatively small amount with the high-sensitivity photoelectric conversion element.

Meanwhile, in a case where each of the low-sensitivity photoelectric conversion elements is disposed to adjoin an associated one of the high-sensitivity photoelectric conversion elements, and where the general Bayer array is employed, the photoelectric conversion elements are arranged according to the array pattern of shown in, for example, FIG. 4. In FIG. 4, characters "R", "G", and "B" designate a photoelectric conversion element used to detect the R-color, a photoelectric conversion element used to detect the G-color, and a photoelectric conversion element used to detect the B-color, respectively. Also, in FIG. 4, circles represent high-sensitivity photoelectric conversion elements. Squares represent low-sensitivity photoelectric conversion elements.

In the solid-state imaging device having the array pattern of the photoelectric conversion elements (for example, photodiodes, and hereunder sometimes abbreviated as "PD") shown in FIG. 4, a PD line on which high-sensitivity photoelectric conversion elements are arranged is paired with an adjacent PD line on which low-sensitivity photoelectric conversion elements are arranged. For example, a PD line L11 of high-sensitivity photoelectric conversion elements and an adjacent PD line L21 of low-sensitivity photoelectric conversion elements constitute a paired line set PL1. Similarly, a PD line L12 of high-sensitivity photoelectric conversion elements and an adjacent PD line L22 of low-sensitivity photoelectric conversion elements constitute a paired line set PL2. A PD line L13 of high-sensitivity photoelectric conversion elements and an adjacent PD line L23 of low-sensitivity photoelectric conversion elements constitute a paired line set PL3. A PD line L14 of high-sensitivity photoelectric conversion elements and an adjacent PD line L24 of low-sensitivity photoelectric conversion elements constitute a paired line set PL4.

Accordingly, wide dynamic range image signals can be obtained by processing signals read from the photoelectric conversion elements in units of the paired line sets (PL1, PL2, PL3, . . . ) and using signals detected at a relatively low sensitivity and signals detected at a relatively high sensitivity corresponding to each color.

Meanwhile, paying attention to the color components, in the array pattern shown in FIG. 4, photoelectric conversion elements respectively detecting R-color, G-color, R-color, G-color, R-color, are arranged in this order on each of odd-numbered PD lines (L11 and L13) from the top line of a group of the PD lines of high-sensitivity photoelectric conversion elements and odd-numbered PD lines (L21 and L23) from the top line of a group of the PD lines of low-sensitivity photoelectric conversion elements. Also, photoelectric conversion elements respectively detecting G-color, B-color, G-color, B-color, G-color, . . . are arranged in this order on each of even-numbered PD lines (L12 and L14) from the top line of a group of the PD lines of high-sensitivity photoelectric conversion elements and even-numbered PD lines (L22 and L24) from the top line of a group of the PD lines of low-sensitivity photoelectric conversion elements.

That is, no photoelectric conversion elements adapted to detect B-color are provided on the odd-numbered PD lines. Also, no photoelectric conversion elements adapted to detect R-color are provided on the even-numbered PD lines. Therefore, all the color components "R", "G", and "B" cannot be obtained only by processing signals in units of the paired line sets. Consequently, a color image of an object cannot be reproduced. In the case of reading signals from all the photoelectric conversion elements, a lacking color component can be obtained by interpolation through image processing utilizing signals outputted from adjacent paired line sets. However, in the case of using a digital camera, due to the limitation of memory capacity and to reduction of an imaging time, it is necessary to take images of an object at the highest resolution and at a lower resolution.

In the case of taking an image of an object at a relatively low resolution, generally, when signals are read from the photoelectric conversion elements of the solid-state imaging device, thinning is performed in units of the paired line sets. For example, the reading of signals from the photoelectric conversion elements of the even-numbered paired line sets (PL2, PL4, . . . ) is omitted. That is, signals are read only from the photoelectric conversion elements of the odd-numbered paired line sets (PL1, PL3, . . . ), among the photoelectric conversion elements arranged according to the array pattern shown in FIG. 4. Thus, an image, whose longitudinal resolution is reduced by half, can be obtained.

However, photoelectric conversion elements detecting B-color are not provided on the odd-numbered paired line sets. Thus, in the case of omitting the reading of signals from the even-numbered paired line sets, on each of which photoelectric conversion elements detecting B-color are provided, a color image of an object cannot be reproduced.

Also, in the case of reading signals only from the even-numbered paired-line sets and omitting the reading of signals from the odd-numbered paired-line sets, because photoelectric conversion elements detecting R-color are not provided on the even-numbered paired-line sets, a color image of an object cannot be reproduced.

To solve the above problems, it is necessary to set paired line sets, on which the thinning is performed, so that all of the photoelectric conversion element detecting R-color, the photoelectric conversion element detecting G-color, and the photoelectric conversion element detecting B-color are included by the paired line sets from which signals are read. To perform thinning on the solid-state imaging device described in JP-A-2004-055786 so that a color image of an object can be reproduced, it is necessary to perform, for example, a process of reading signals from the paired line sets PL1 and PL2 and thinning the paired line sets PL3 and PL4. Thus, control timing is complicated. The control timing is simplest in the case of performing thinning on every other paired line set.

However, no the related-art solid-state imaging devices are configured to enable such a control operation.

SUMMARY OF THE INVENTION

An object of the invention is to provide a solid-state imaging device enabled to reproduce a color image without complicating control timing even in a case where thinning is performed in units of lines when signals are read from photoelectric conversion elements.

According to the invention, there is provided a solid-state imaging device comprising: a semiconductor substrate; and a plurality of photoelectric conversion elements arranged on the semiconductor substrate in a row direction and in a column direction orthogonal to the row direction, wherein the photoelectric conversion elements are divided into a first group and a second group, each of the first group and the second group is configured so that photoelectric conversion element lines arranged in the column direction, each of which includes those of photoelectric conversion elements arranged in the row direction, and that at least three kinds of photoelectric conversion elements respectively detecting different color components are arranged according to a predetermined array pattern, each of those of the photoelectric conversion elements included by the first group is disposed at a position displaced in a predetermined direction with respect to a position of each of those of the photoelectric conversion elements included by the second group so that one of the photoelectric conversion elements included by the first group adjoins each of the photoelectric conversion elements included by the second group, the array pattern is determined so that at least said three kinds of photoelectric conversion elements are included by adjacent two of the photoelectric conversion element lines in each of the first group and the second group, and in a case where one of the photoelectric conversion element lines included by the first group is set to be a first target line, where ones of the photoelectric conversion element lines included by the second group adjoining the first target line are set to be second target lines, and where when a combination of color components detected by the photoelectric conversion elements included by one of the second target lines differs from a combination of color components detected by the photoelectric conversion elements arranged on the first target line, said one of the second target lines is set to be a third target line, a charge reading electrode configured to read charge from those of the photoelectric conversion elements belonging to the first target line, and a charge reading electrode configured to read charge from those of the photoelectric conversion elements belonging to the third target line are electrically connected to a common terminal.

According to an embodiment of the invention, there is provided the solid-state imaging device, wherein a sensitivity difference is provided between a detection sensitivity of each of the photoelectric conversion elements included by the first group and a detection sensitivity of each of the photoelectric conversion elements included by the second group.

According to an embodiment of the invention, there is provided the solid-state imaging device, wherein the array pattern is a Bayer array pattern.

According to an embodiment of the invention, there is provided the solid-state imaging device, wherein charge reading electrodes each of which is configured to control reading of charge from an associated one of the photoelectric conversion element lines included by the first group, are alternately and electrically connected to a first common terminal and a second common terminal every other photoelectric conversion element line in the first group; and charge reading electrodes each of which is configured to control reading of charge from an associated one of the photoelectric conversion element lines included by the second group, are alternately and electrically connected to the second common terminal and the first common terminal every other photoelectric conversion element line in the second group.

DETAILED DESCRIPTION OF THE INVENTION

First Embodiment

Figure 1:
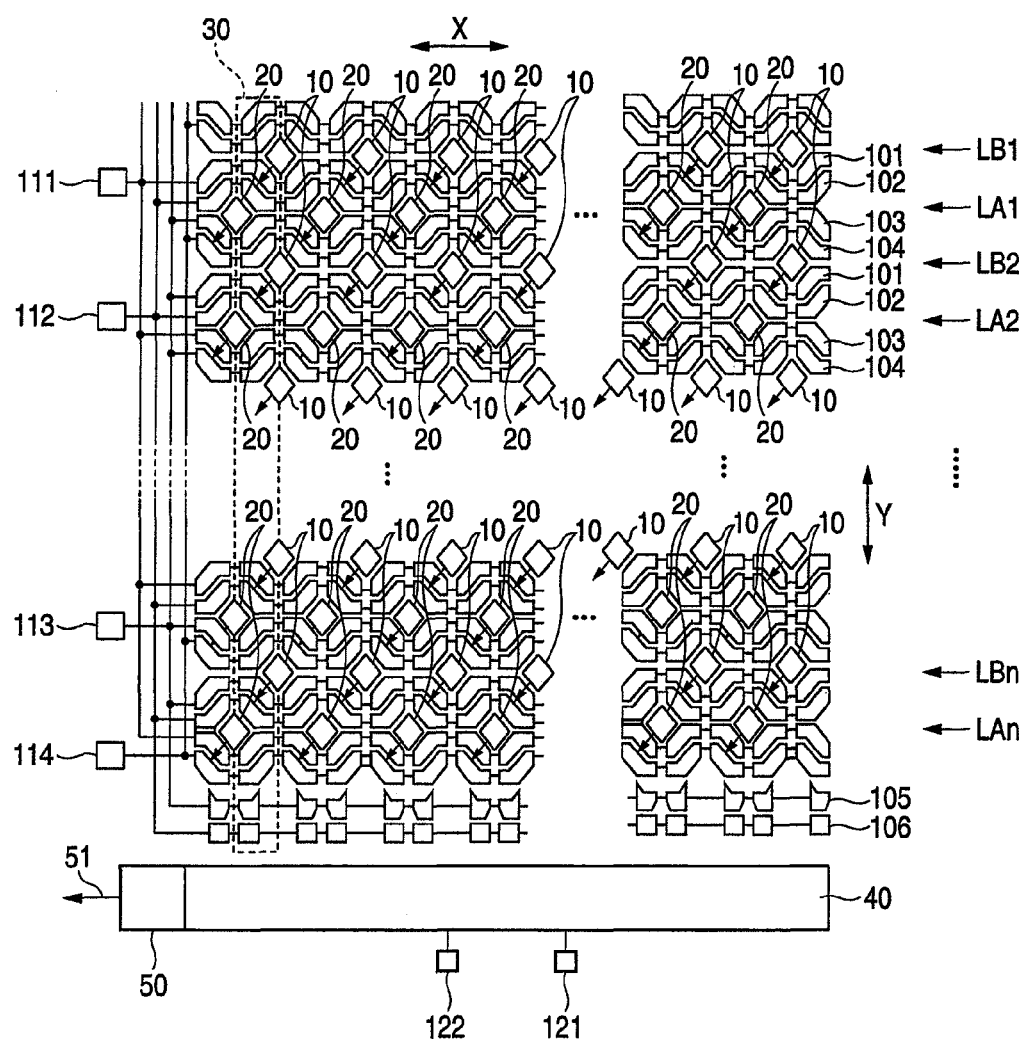
FIG. 1 is a plan view illustrating the configuration schematically illustrating the configuration of a solid-state imaging device according to a first embodiment of the invention.

FIG. 1 is a plan view illustrating the configuration schematically illustrating the configuration of a solid-state imaging device according to a first embodiment of the invention.

The solid-state imaging device shown in FIG. 1 has a large number of low-sensitivity photoelectric conversion elements 10 having a low detection sensitivity arranged on a silicon substrate in a row direction X and in a column direction Y orthogonal thereto and also has high-sensitivity photoelectric conversion elements 20. Also, the solid-state imaging device shown in FIG. 1 has vertical charge transfer portions (VCCDs) 30 (in FIG. 1, the VCCDs 30 is partly designated by reference numeral) configured to transfer electric charges stored in the low-sensitivity photoelectric conversion elements 10 and the high-sensitivity photoelectric conversion elements 20 in the column direction Y, and has a horizontal charge transfer portion (HCCD) 40 configured to transfer the charge transferred through the VCCDs 30 in the row direction X. Also, the solid-state imaging device shown in FIG. 1 has a signal output portion 50 configured to output a voltage signal corresponding to the charge transferred through the HCCD 40.

The low-sensitivity PDs 10 and the high-sensitivity PDs 20 are arranged like a square lattice in the row direction X and in the column direction Y orthogonal thereto. The array pitch of the low-sensitivity PDs 10 is equal to that of the high-sensitivity PDs 20. The position of each of the low-sensitivity PDs 10 is shifted from the position of an associated one of the high-sensitivity PDs 20 a by (½) of the array pitch in the row direction X and in the column direction Y. To change the sensitivity of the low-sensitivity PDs 10 and the high-sensitivity PDs 20, the area of the light receiving surface of the PD may be changed or the collecting area thereof may be changed by a microlens provided above the PD. Alternatively, the low-sensitivity PDs may be made to differ from the high-sensitivity PDs in exposure time. Alternatively, the amplification factor of the charge obtained from the low-sensitivity PDs 10 in the signal output portion 50 may be made to differ from that of the charges obtained from the high-sensitivity PDs 20.

A group of the low-sensitivity PDs 10 is a large number of PD lines, each of which is a large number of the low-sensitivity PDs 10 arranged in the row direction X, arranged in the column direction Y. A group of the high-sensitivity PDs 20 is a large number of PD lines, each of which is a large number of the high-sensitivity PDs 20 arranged in the row direction X, arranged in the column direction Y. As shown in FIG. 1, the group of the low-sensitivity PDs 10 is constituted by a large number of PD lines LBn (n is a natural number) arranged in the column direction Y. The group of the high-sensitivity PDs 20 is constituted by a large number of PD lines LAn (n is a natural number) arranged in the column direction Y.

The VCCD 30 includes a vertical transfer channel (not shown) formed on the silicon substrate, a plurality of vertical transfer electrodes 101 to 104 formed so that the vertical transfer channels are intersected in plan view, and charge reading areas (schematically indicated by arrows in FIG. 1) configured to read out of the charges stored in the low-sensitivity PDs 10 and the high-sensitivity PDs 20 to the vertical transfer channels.

Each of the vertical transfer channels extends in a meandering shape in the column direction Y as a whole between the low-sensitivity PD 10 and the high-sensitivity PD 20. The area, in which the charges are stored, is partitioned off from the area, in which the charges are transferred, by the vertical transfer electrodes 101 to 104. The four vertical transfer electrodes 101 to 104 are provided corresponding to the low-sensitivity PDs 10 and the high-sensitivity PDs 20 (only the vertical transfer electrodes corresponding to two lines of the high-sensitivity PDs are designated by reference numerals in FIG. 1). Each of the vertical transfer electrodes 101 to 104 extends in a meandering shape in the row direction X as a whole between the low-sensitivity PD 10 and the high-sensitivity PD 20. The vertical transfer electrode 101 is an electrode (hereunder referred to as an electrode for reading charge from the PD 10) configured to apply a reading pulse to the charge reading area corresponding to the low-sensitivity PD 10. The vertical transfer electrode 103 is an electrode (hereunder referred to as an electrode for reading charge from the PD 20) configured to apply a reading pulse to the charge reading area corresponding to the high-sensitivity PD 20.

Quadratic-phase vertical transfer pulses are applied to the vertical transfer electrodes 101 to 104 through the terminals 111 to 114, respectively, so that the charges from the vertical transfer channels are transferred in the column direction Y. The vertical transfer pulses are also applied to transfer electrodes 105 and 106 provided between the VCCD 30 and the HCCD 40. Every cycle of the vertical transfer pulse, charges detected by the low-sensitivity PDs 10 of one line and the high-sensitivity PDs 20 of one line are transferred to the HCCD 40. Reading of charges from the low-sensitivity PDs 10 of one line and the high-sensitivity PDs 20 is performed by superposing reading-pulses on a first phase pulse applied immediately after a vertical charge transfer is started (a vertical transfer pulse to be applied to the terminal 111) and a third phase pulse (a vertical transfer pulse to be applied to the terminal 113).

In the solid-state imaging device shown in FIG. 1, the electrode (the vertical transfer electrode 103) for reading charges from each of the odd-numbered PD lines (for example, LA1) among the PD lines each of which includes the high-sensitivity PDs 20, and the electrode (the vertical transfer electrode 101) for reading charges from each of the even-numbered PD lines (for example, LB2) among the PD lines each of which includes the low-sensitivity PDs 10, are connected in common to the terminal 113. The electrode (the vertical transfer electrode 101) for reading charges from each of the odd-numbered PD lines (for example, LB1) among the PD lines each of which includes the low-sensitivity PDs 10, and the electrode (the vertical transfer electrode 103) for reading charges from each of the even-numbered PD lines (for example, LA2) among the PD lines each of which includes the high-sensitivity PDs 20, are connected in common to the terminal 111.

That is, the reading of charges from the odd-numbered PD lines among the PD lines each of which includes the high-sensitivity PDs 20, and that of charges from the even-numbered PD lines among the PD lines each of which includes the low-sensitivity PDs 10, can be controlled with the same timing by a control pulse applied to the terminal 113. Similarly, the reading of charges from the odd-numbered PD lines among the PD lines each of which includes the low-sensitivity PDs 10, and that of charges from the even-numbered PD lines among the PD lines each of which includes the high-sensitivity PDs 20, can be controlled with the same timing by a control pulse applied to the terminal 111.

The HCCD 40 includes a horizontal transfer channel (not shown) formed in the silicon substrate, and also includes a horizontal transfer electrode (not shown) formed above the horizontal transfer channel. Biphasic horizontal transfer pulses are applied to the horizontal transfer electrode through the terminals 121 and 122. Charges detected by the low-sensitivity PDs 10 of one line and the high-sensitivity PDs 20 of one line, which are transferred from the VCCD 30, are further transferred to the signal output portion 50.

In the solid-state imaging device constructed in this way, charges stored in the low-sensitivity PDs 10 and the high-sensitivity PDs 20 according to the intensity of incident light from a field are read to the vertical transfer channel in response to reading pulses superposed on the first phase vertical transfer pulse and the third phase vertical transfer pulse. Then, the read charges are transferred in the vertical transfer channel in response to a vertical transfer pulse. Thus, the charges are held in a predetermined area of the horizontal transfer channel. Subsequently, when a horizontal transfer pulse is applied to the electrode, the held charges are serially sent to the signal output portion 50. Then, a voltage signal 51 corresponding to an amount of electric charge is outputted therefrom.

Figure 2:
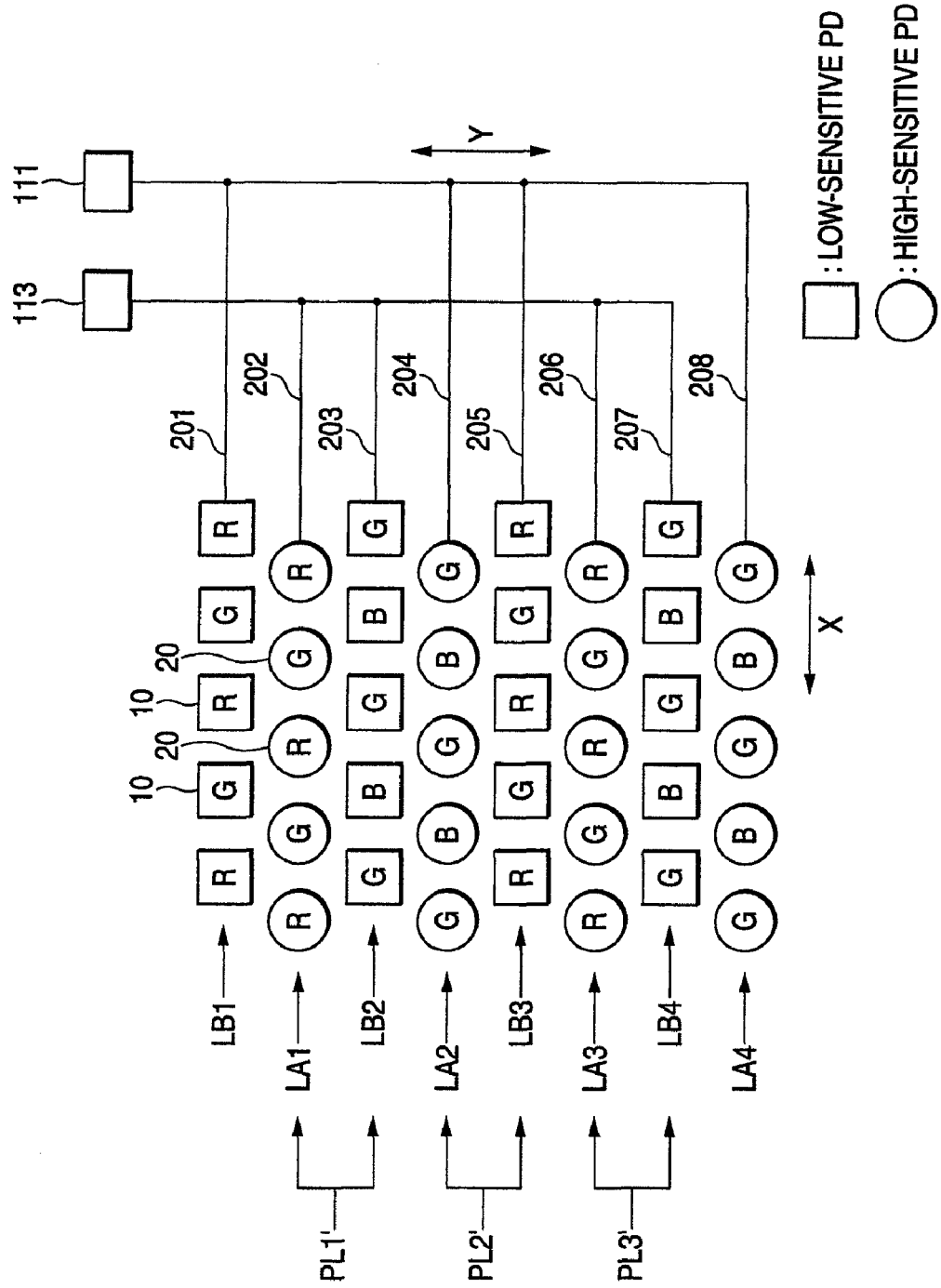
FIG. 2 is a plan view illustrating a practical example of the array pattern of photoelectric conversion elements and charge reading electrodes of the solid-state imaging device shown in FIG. 1.

Next, the connection relationship between the practical array pattern of the low-sensitivity PDs 10 and the high-sensitivity PDs 20 and the electrode for reading charges from each of the PDs is described below with reference to FIG. 2. FIG. 2 is a plan view schematically illustrating the connection relationship between the practical array pattern of the low-sensitivity PDs 10 and the high-sensitivity PDs 20 of the solid-state imaging device shown in FIG. 1 and the electrode for reading charges from each of the PDs. In FIGS. 1 and 2, like reference numeral designates like components. Also, in FIG. 2, squares represent the low sensitivity PDs 10, respectively. Circles represent the high-sensitivity PDs 20, respectively. Also, in each of the squares and the circles, a color component detected by the associated PD is designated by character "R", "G", or "B". For simplicity of description, FIG. 2 shows only the low-sensitivity PDs 10 of 4 rows by 5 columns and the high-sensitivity PDs 20 of 4 rows by 5 columns.

Although the difference among color components detected by the low-sensitivity PDs 10 and the high-sensitivity PDs 20 can be determined by the structure and the electric characteristic of each of the photodiodes, actually, a method of determining the color component, which is to be detected by each of the photodiodes, according to the characteristic of an optical color filter disposed in front of the light receiving surface of each of the photodiodes is easily performed. Therefore, as shown in FIG. 2, it is sufficient that a large number of low-sensitivity PDs 10 having the same detection characteristic and a large number of high-sensitivity PDs 20 having the same detection characteristic are arranged at a regular interval, and that optical filters transmitting R-color, optical filters transmitting G-color, and optical filters transmitting B-color are disposed above the light receiving surfaces of the PDs according to the array pattern shown in FIG. 2.

Incidentally, for readily understanding, the group of the low-sensitivity PDs 10 and the group of the high-sensitivity PDs 20 are considered separately from each other. As shown in FIG. 2, the group of the low-sensitivity PDs 10 includes PD lines LB1, LB2, LB3, LB4, . . . . Also, the group of the high-sensitivity PDs 20 includes PD lines LA1, LA3, LA4, . . . .

First, paying attention to the group of the high-sensitivity PDs 20, the high-sensitivity PDs 20 respectively detecting R-color, G-color, R-color, G-color, R-color, . . . , are regularly arranged on a first PD line LA1. Also, the high-sensitivity PDs 20 respectively detecting G-color, B-color, G-color, B-color, G-color, . . . , are regularly arranged on a second PD line LA2. Additionally, the high-sensitivity PDs 20 are regularly arranged on a third PD line LA3, similarly to the first PD line LA1. Also, the high-sensitivity PDs 20 are regularly arranged on a fourth PD line LA4, similarly to the second PD line LA2. That is, the high-sensitivity PDs 20 are regularly arranged according to the known Bayer array.

Next, paying attention to the group of the low-sensitivity PDs 10, the low-sensitivity PDs 10 respectively detecting R-color, G-color, R-color, G-color, R-color, . . . , are regularly arranged on a first PD line LB1. Also, the low-sensitivity PDs 10 respectively detecting G-color, B-color, G-color, B-color, G-color, . . . , are regularly arranged on a second PD line LB2. Additionally, the low-sensitivity PDs 10 are regularly arranged on a third PD line LB3, similarly to the first PD line LB1. Also, the low-sensitivity PDs 10 are regularly arranged on a fourth PD line LB4, similarly to the second PD line LB2. That is, similarly, the low-sensitivity PDs 10 are regularly arranged according to the known Bayer array.

Meanwhile, in a case where signals are read from the low-sensitivity PDs 10 and a large number of the high-sensitivity PDs 20 every other line in the solid-state imaging device in which a large number of the low-sensitivity PDs 10 and a large number of the high-sensitivity PDs 20 are arranged according to the array pattern shown in FIG. 2, obtained color components are not all the color components constituting a color image.

For example, paying attention to the first PD line LA1 of the group of the high-sensitivity PDs 20, only the high-sensitivity PDs 20 detecting R-color and G-color are included. However, the high-sensitivity PDs 20 detecting B-color are not included. Similarly, paying attention to the second PD line LA2 of the group of the high-sensitivity PDs 20, only the high-sensitivity PDs 20 detecting G-color and B-color are included. However, the high-sensitivity PDs 20 detecting R-color are not included.

Similarly, paying attention to the first PD line LB1 of the group of the low-sensitivity PDs 10, only the low-sensitivity PDs 10 detecting R-color and G-color are included. However, the low-sensitivity PDs 10 detecting B-color are not included. Also, paying attention to the second PD line LB2 of the group of the low-sensitivity PDs 10, only the low-sensitivity PDs 10 detecting G-color and B-color are included. However, the low-sensitivity PDs 10 detecting R-color are not included.

Therefore, in a case where one of the PD lines is singly processed, one of the color components R, G, and B is lacking. Consequently, the color image cannot be reproduced. It is apparent that image processing can be performed so that pixels are interpolated by combining image signals outputted from the PDs of the adjacent PD lines.

However, it is necessary for a photograph device, such as a digital camera, to read image data not only at the maximum resolution but at a lower resolution so as to speed up the reading of image data and as to suppress memory capacity to be used. In the case of reading an image at a lower resolution, image signals are read by thinning those in units of PD lines. For example, the reading of image signals are performed every other PD line.

Assuming that thinning is performed, for example, every other PD line, in a case where signals are read only from the odd-numbered PD lines LA1, LA3, . . . , of the group of the high-sensitivity PDs 20 shown in FIG. 2, a B-color component is lacking. In a case where signals are read only from the even-numbered PD lines LA2, LA4, . . . , of the group of the high-sensitivity PDs 20, and R-color component is lacking. This is the same with the group of the low-sensitivity PDs 10.

Thus, as shown in FIG. 2, the charge reading electrodes are connected to the PD lines that are adjacent paired lines, from which signals are simultaneously read, and that are respectively selected from the group of the low-sensitivity PDs 10 and the group of the high-sensitivity PDs 20 so that the combination of color components detected by the PDs of the PD line selected from the group of the low-sensitivity PDs 10 differs from the combination of color components detected by the PDs of the PD line selected from the group of the high-sensitivity PDs 20.

For example, only the G-color component and the B-color component are obtained from the PD line LB2 of the group of the low-sensitivity PDs 10. Also, only the R-color component and the G-color component are obtained from the PD line LA1 of the group of the high-sensitivity PDs 20. Thus, these PD lines differ from each other in the combination of the obtained color components. A wire 203 connected to an electrode for reading charges from the low-sensitivity PDs 10 arranged on the PD line LB2, and another wire 202 connected to an electrode for reading charges from the high-sensitivity PDs 20 arranged on the PD line LA1 are connected to the common terminal 113.

Meanwhile, only the R-color component and the G-color component are obtained from the PD line LB3 of the group of the low-sensitivity PDs 10. Also, only the G-color component and the B-color component are obtained from the PD line LA2 of the group of the high-sensitivity PDs 20. Thus, these PD lines differ from each other in the combination of the obtained color components. A wire 205 connected to an electrode for reading charges from the low-sensitivity PDs 10 arranged on the PD line LB3, and another wire 204 connected to an electrode for reading charges from the high-sensitivity PDs 20 arranged on the PD line LA2 are connected to the common terminal 111.

Similarly, a wire 207 connected to an electrode for reading charges from the low-sensitivity PDs 10 arranged on the PD line LB4, and another wire 206 connected to an electrode for reading charges from the high-sensitivity PDs 20 arranged on the PD line LA3 are connected to the common terminal 113. Also, a wire 208 connected to an electrode for reading charges from the high-sensitivity PDs 20 arranged on the PD line LA4, and another wire 201 connected to an electrode for reading charges from the low-sensitivity PDs 10 arranged on the PD line LB1 are connected to the common terminal 111.

That is, in the group of the low-sensitivity PDs 10, an electrode for reading charges, which is used to control the reading of charges from a (2m−1)th PD line (m is a natural number) is connected to the terminal 111. Another electrode for reading charges, which is used to control the reading of charges from a 2m-th PD line (m is a natural number) is connected to the terminal 113. In the group of the high-sensitivity PDs 20, an electrode for reading charges, which is used to control the reading of charges from a 2m-th PD line (m is a natural number) is connected to the terminal 111. Another electrode for reading charges, which is used to control the reading of charges from a (2m−1)th PD line (m is a natural number) is connected to the terminal 113.

Therefore, in a case where thinning is performed every other PD line, it is sufficient to apply a reading pulse only to one of the vertical transfer pulse terminals 111 and 113. For example, when a reading pulse is applied to the terminal 113, the reading pulse is applied only to the odd-numbered paired-line sets PL1', PL3', . . . . Accordingly, thinning can be performed only on the even-numbered paired-line sets PL2', PL4', . . . .

In this case, when the reading of charges from the paired-line set PL1', the G-color component and the B-color component can be obtained from the PD line LB2. Also, the R-color component and the G-color component can be obtained from the PD line LA1. Thus, all the color components R, G, and B can be obtained corresponding to each pixel. Consequently, the color image can be reproduced. That is, even in a case where thinning is performed every other PD line, it is unnecessary to complicate the reading timing and the configuration of the device.

Incidentally, in the case of performing thinning in this manner, the dynamic range cannot be increased by synthesizing a signal from signals respectively outputted by the low-sensitivity PD and the high-sensitivity PD. Thus, it is necessary to signals obtained from the low-sensitivity PD 10 and the high-sensitivity PD 20 to thereby generate image data including pixels of the number of the obtained signals. However, a sensitivity difference is provided between the detection sensitivity of the low-sensitivity PDs 10 and that of the high-sensitivity PDs 20. Thus, in a case where a missing color component is obtained from an adjacent PD line to thereby perform color interpolation, a plurality of signals, which differ from one another due to the sensitivity difference, coexist. Consequently, a correct color balance cannot be obtained. Therefore, in a case where the reading of charges is performed by carrying out thinning, for example, the gain of the signal output portion 50 is adjusted corresponding to each of the PD lines to perform a control operation by eliminating the sensitivity difference between the low-sensitivity PDs 10 and the high-sensitivity PDs 20 so as to correct the color balance.

Also, in a case where thinning of the PD lines is not performed, signals can be read from all the PD lines by applying reading pulses to the terminals 111 and 113. Thus, wide dynamic range image signals can be reproduced by combining signals obtained from the PDs, which differ from one another in sensitivity, corresponding to each of the color components. For example, a signal having a wide dynamic range corresponding to each of the R-color component and the G-color component can be obtained at each pixel from the combination of the PD lines LB1 and LA1. Also, a signal having a wide dynamic range corresponding to each of the G-color component and the B-color component can be obtained at each pixel from the combination of the PD lines LB2 and LA2. Further, all the color components R, G, and B can be generated at each pixel from the combination of the adjacent PD lines LB1, LA1, LB2, and LA2.

Second Embodiment

Figure 3:
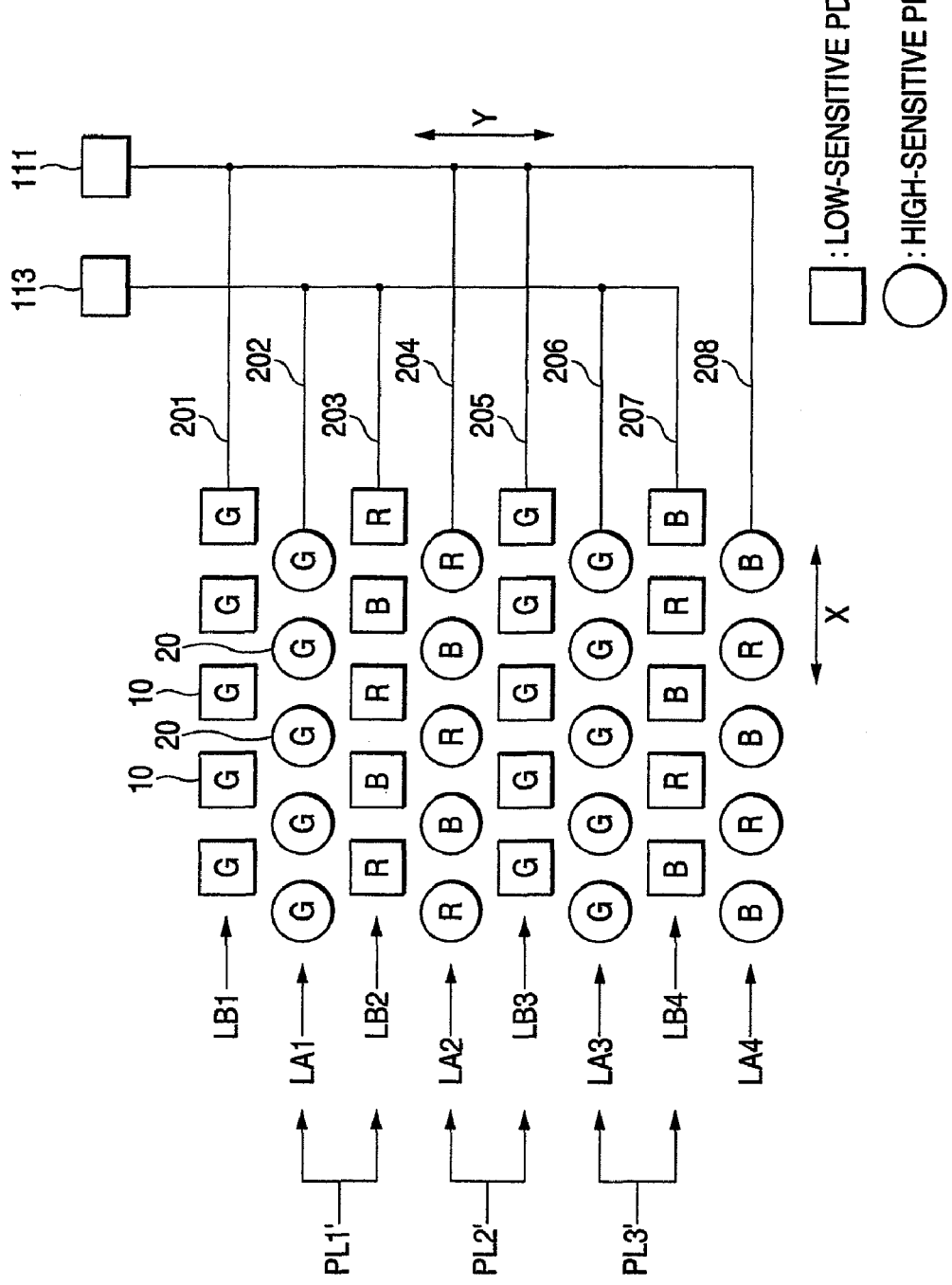
FIG. 3 is a plan view illustrating a practical example of the array pattern of photoelectric conversion elements and charge reading electrodes of a solid-state imaging device according to a second embodiment of the invention.
Figure 4:
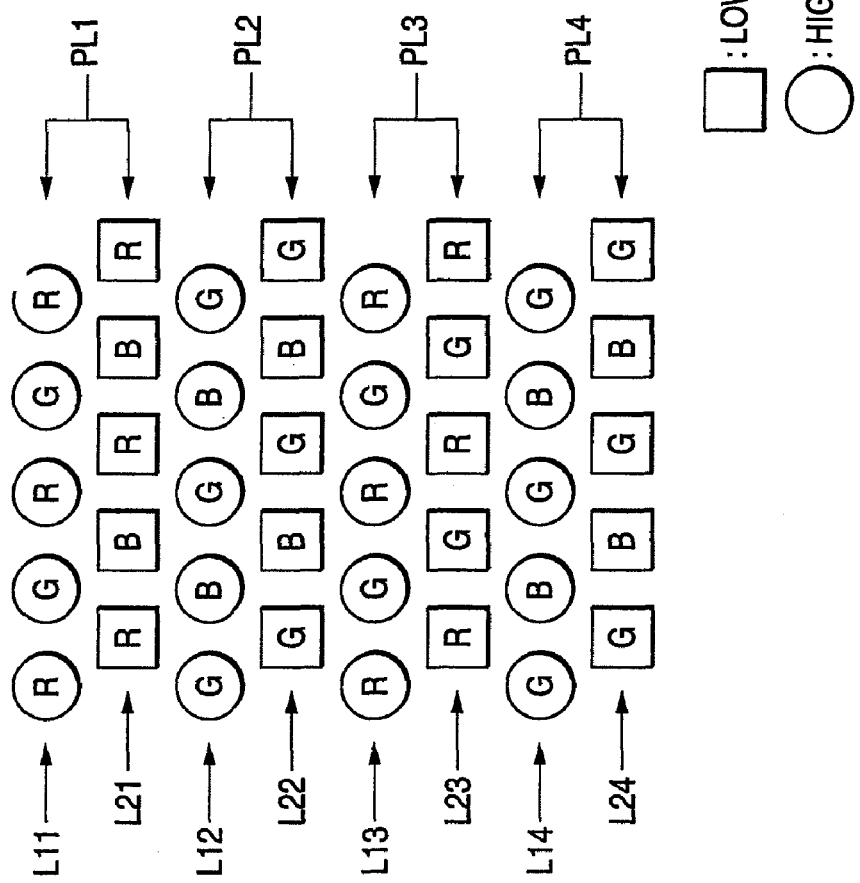
FIG. 4 is a plan view schematically illustrating the array pattern of photoelectric conversion elements in the related-art solid-state imaging device.

Another embodiment of the solid-state imaging device according to the invention is described below with reference to FIG. 3. FIG. 3 is a plan view illustrating a practical example of the array pattern of photoelectric conversion elements and charge reading electrodes of a solid-state imaging device according to a second embodiment of the invention.

The second embodiment is a modification of the first embodiment. The second embodiment is similar to the first embodiment except that the array pattern of the low-sensitivity PDs 10 and the high-sensitivity PDs 20 is changed to the pattern shown in FIG. 3. In FIG. 3, each of components corresponding to those of the first embodiment is designated by the same reference numeral used to denote the corresponding component of the first embodiment. The changed array pattern is described below.

First, paying attention to the group of the low-sensitivity PDs 10, only the low-sensitivity PDs 10 detecting the G-color are arranged on the PD line LB1. The low-sensitivity PDs 10 detecting the R-color and the low-sensitivity PDs 10 detecting the B-color are alternately arranged on the PD line LB2. Similarly to the PD line LB1, only the low-sensitivity PDs 10 detecting the G-color are arranged on the PD line LB3. Similarly to the PD line LB2, the low-sensitivity PDs 10 detecting the R-color and the low-sensitivity PDs 10 detecting the B-color are alternately arranged on the PD line LB4. That is, only the low-sensitivity PDs 10 detecting the G-color are arranged on each of the odd-numbered PD lines LB1, LB3, . . . . The low-sensitivity PDs 10 detecting the R-color and the low-sensitivity PDs 10 detecting the B-color are alternately arranged on each of the even-numbered PD lines LB2, LB4, . . . . Also, the even-numbered PD line and the odd-numbered PD line, which are adjacent to each other, are adapted to include the PDs respectively detecting all the color components R, G, B. Additionally, regarding the even-numbered PD lines, the position of each of the PDs detecting the R-color and the position of each of the PDs detecting the B-color are alternately shifted every odd-numbered PD line.

Next, paying attention to the group of the high-sensitivity PDs 20, it is found that the array pattern thereof is the same as the array pattern of the low-sensitivity PDs 10. That is, the high-sensitivity PDs 20 detecting the R-color and the high-sensitivity PDs 20 detecting the B-color are alternately arranged on each of the even-numbered PD lines LA2, LA4, . . . . Only the high-sensitivity PDs 20 detecting the G-color are arranged on each of the odd-numbered PD lines LA1, LA3, . . . . Also, the even-numbered PD line and the odd-numbered PD line, which the adjacent to each other, are adapted to include the high-sensitivity PDs respectively detecting all the color components R, G, B.

Even in the case of employing such an array pattern, the reading of charges can easily be performed by simultaneously carrying out thinning. Also, in a case where the reading of charges is performed without carrying out thinning, the dynamic range of the signals can be increased.

Incidentally, the solid-state imaging device according to each of the first embodiment and the second embodiment is configured so that the PDs of the group of the low-sensitivity PDs 10 are combined with those of the group of the high-sensitivity PDs 20. However, the solid-state imaging device according to the invention may be configured so that no detection sensitivity difference is eliminated from between the low-sensitivity PDs 10 and the high-sensitivity PDs 20.

Incidentally, it is advisable to employ a desired pattern as the array pattern of the photodiodes according to need. At present, a highest-quality color image can be obtained by using the Bayer array shown in FIG. 2.

Additionally, in the foregoing description, it has been described that the number of color components detected by the low-sensitivity PDs 10 is 3, and that the number of color components detected by the high-sensitivity PDs 20 is 3. However, the number of color components detected by the PDs may be equal to or more than 4.

The invention can provide a solid-state imaging device enabled to reproduce a color image without complicating a circuit configuration and control timing even in a case where thinning is performed in units of lines when signals are read from photoelectric conversion elements.

The entire disclosure of each and every foreign patent application from which the benefit of foreign priority has been claimed in the present application is incorporated herein by reference, as if fully set forth.

What is claimed is:

1. A solid-state imaging device, comprising:
a semiconductor substrate; and
a plurality of photoelectric conversion elements arranged on the semiconductor substrate in a row direction and in a column direction orthogonal to the row direction,
wherein the photoelectric conversion elements have high-sensitive photoelectric conversion elements as a first group and low-sensitive photoelectric conversion elements as a second group,
each of the first group and the second group is configured so that photoelectric conversion element lines arranged in the column direction, each of which includes those of photoelectric conversion elements arranged in the row direction, and that at least three kinds of photoelectric conversion elements respectively detecting different color components are arranged according to an array pattern,
each of those of the photoelectric conversion elements included by the first group is disposed at a position displaced in a predetermined direction with respect to a position of each of those of the photoelectric conversion elements included by the second group so that one of the photoelectric conversion elements included by the first group adjoins each of the photoelectric conversion elements included by the second group,
the array pattern is determined so that at least said three kinds of photoelectric conversion elements are included by adjacent two of the photoelectric conversion element lines in each of the first group and the second group,
one of the photoelectric conversion element lines included by the first group is a first target line,
ones of the photoelectric conversion element lines included by the second group are second target lines,
the second target lines adjoin the first target line,
one of the second target lines is a third target line,
a combination of color components detected by the photoelectric conversion elements arranged on the third target line differs from a combination of color components detected by the photoelectric conversion elements arranged on the first target line,
a first charge reading electrode is configured to read charge from the photoelectric conversion elements belonging to the first target line,
a second charge reading electrode is configured to read charge from the photoelectric conversion elements belonging to the third target line, and the first charge reading electrode and the second charge reading electrode are electrically connected to a common terminal.

2. The solid-state imaging device according to claim 1, wherein the array pattern is a Bayer array pattern.

3. The solid-state imaging device according to claim 1, wherein charge reading electrodes each of which is configured to control reading of charge from an associated one of the photoelectric conversion element lines included by the first group, are alternately and electrically connected to a first common terminal and a second common terminal every other photoelectric conversion element line in the first group; and charge reading electrodes each of which is configured to control reading of charge from an associated one of the photoelectric conversion element lines included by the second group, are alternately and electrically connected to the second common terminal and the first common terminal every other photoelectric conversion element line in the second group.

4. The solid-state imaging device according to claim 1, wherein said at least three kinds of photoelectric conversion elements comprises a photoelectric conversion element detecting R-color, a photoelectric conversion element detecting G-color and a photoelectric conversion element detecting B-color.

5. The solid-state imaging device according to claim 1, wherein each of the first target line and the third target line comprises those of the photoelectric conversion elements of at least two kinds.

6. The solid-state imaging device according to claim 1, wherein the first target line comprises those of the photoelectric conversion elements of one kind, and the third target line comprises those of the photoelectric conversion elements of the other kinds.

* * * * *